United States Patent
Chew et al.

(10) Patent No.: US 7,736,044 B2
(45) Date of Patent: Jun. 15, 2010

(54) INDIRECT LIGHTING DEVICE FOR LIGHT GUIDE ILLUMINATION

(75) Inventors: Tong Fatt Chew, Penang (MY); Siew It Pang, Penang (MY); Sundar Natarajan Yoganandan, Penang (MY); Kee Yean Ng, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 210 days.

(21) Appl. No.: 11/441,503

(22) Filed: May 26, 2006

(65) Prior Publication Data

US 2007/0274096 A1  Nov. 29, 2007

(51) Int. Cl.
*F21V 7/04* (2006.01)
(52) U.S. Cl. ............ 362/612; 362/249.02; 362/294; 362/373; 362/609; 362/613
(58) Field of Classification Search .......... 362/294, 362/373, 609, 612, 800, 97.3, 217.05, 249.02, 362/296.01, 613
See application file for complete search history.

(56) References Cited

U.S. PATENT DOCUMENTS

| | | | |
|---|---|---|---|
| 7,168,842 B2 * | 1/2007 | Chou et al. | 362/612 |
| 7,293,906 B2 * | 11/2007 | Mok et al. | 362/609 |
| 2005/0052732 A1 | 3/2005 | Chen et al. | |
| 2005/0190561 A1 * | 9/2005 | Ng et al. | 362/800 |
| 2005/0270783 A1 | 12/2005 | Liu et al. | |
| 2006/0002141 A1 * | 1/2006 | Ouderkirk et al. | 362/609 |
| 2006/0072339 A1 * | 4/2006 | Li et al. | 362/612 |
| 2006/0239034 A1 * | 10/2006 | Keh et al. | 362/612 |

FOREIGN PATENT DOCUMENTS

| | | |
|---|---|---|
| JP | 2000/113708 | 4/2000 |
| JP | 2000/299011 | 10/2000 |
| JP | 2005/108675 | 4/2005 |

* cited by examiner

Primary Examiner—Stephen F Husar

(57) ABSTRACT

A lighting apparatus is described. One embodiment of the lighting apparatus includes a substrate and a lighting element. The lighting element is coupled to the substrate to emit light through a light exit plane. The light exit plane is substantially perpendicular to the substrate. By providing a lighting device with a substrate oriented perpendicular to the light exit plane of the lighting device, the lighting device can enable better mixing of the light from different LEDs. The lighting apparatus facilitates light mixing, generally, to minimize or eliminate dark spots on the diffusion panel. The lighting device also facilitates color mixing to produce relatively consistent white light on the diffusion panel.

20 Claims, 10 Drawing Sheets

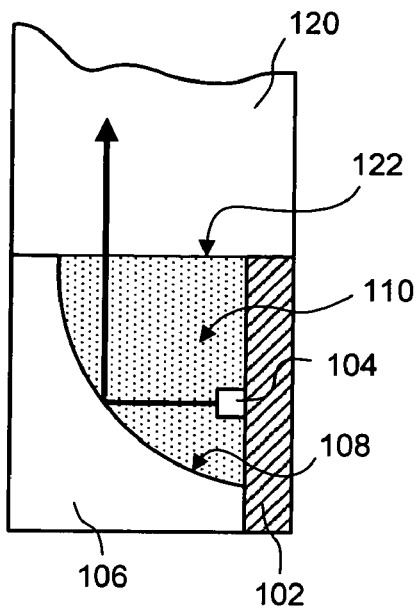
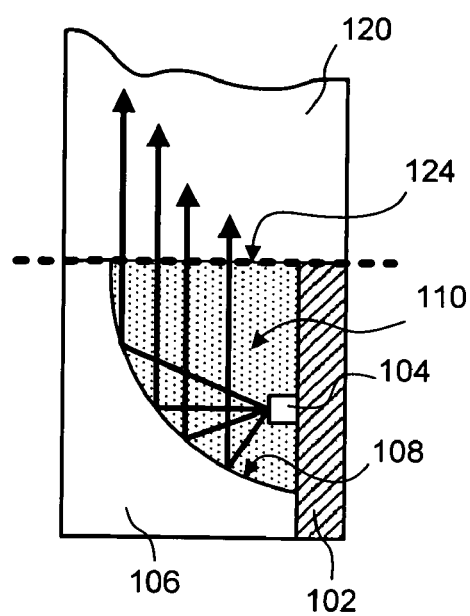
FIG. 4          FIG. 5
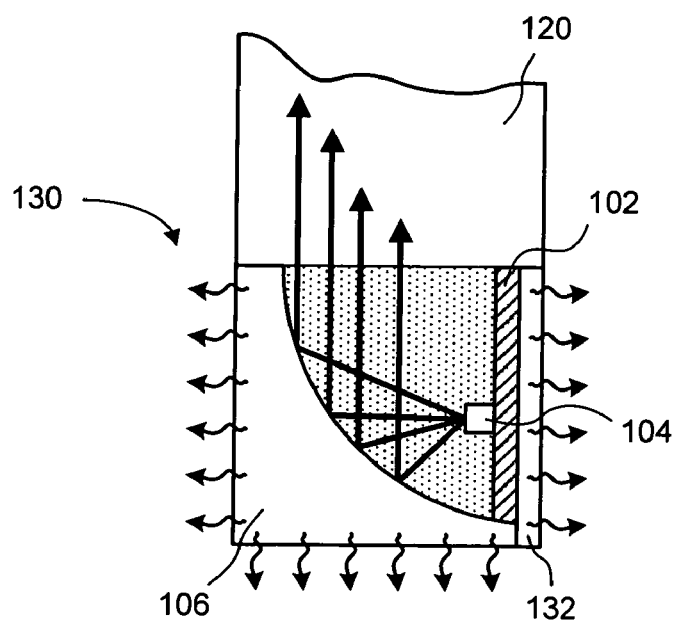
FIG. 6

INDIRECT LIGHTING DEVICE FOR LIGHT GUIDE ILLUMINATION

BACKGROUND OF THE INVENTION

Most liquid crystal display (LCD) panels use backlighting to provide a bright image to the viewer. Backlighting is typically provided by diffusing white light from a fluorescent light source or several light emitting diode (LED) sources. To provide evenly distributed backlighting, LCD panels have a diffusion panel that receives the light along one edge of the panel and diffuses the light throughout the face of the diffusion panel. The white light may be directly generated by the fluorescent light source or the LEDs. However, colored LEDs emitting such colors as red, green, and blue (RGB) are also used in some applications. Where colored LEDs are used, the different colors are mixed to create the white light.

In applications that use LEDs, several LEDs typically are mounted on a single substrate. The LEDs and substrate are referred to as an LED device. One type of LED device is referred to as an LED array. Some LED arrays have individual lenses for each of the LEDs. Other LED arrays have multiple LEDs encapsulated together between reflector walls. Whether the LEDs have individual lenses or are encapsulated together, conventional LED devices cause dark spots, or zones, on an adjacent diffusion panel. For example, the LED devices with individual lenses may have dark spots between adjacent LEDs. LED devices with several LEDs encapsulated together may have dark spots between adjacent LED devices.

In view of this, what is needed is an LED device to provide a better light distribution to overcome the problems of dark spots on the diffusion panel.

SUMMARY OF THE INVENTION

A lighting apparatus is described. One embodiment of the lighting apparatus includes a substrate and a lighting element. The lighting element is coupled to the substrate to emit light through a light exit plane. The light exit plane is substantially perpendicular to the substrate. By providing a lighting device with a substrate oriented perpendicular to the light exit plane of the lighting device, the lighting device can enable better mixing of the light from different LEDs.

In one embodiment, the lighting apparatus facilitates light mixing, generally, to minimize or eliminate dark spots on the diffusion panel. In another embodiment, the lighting device facilitates color mixing to produce relatively consistent white light on the diffusion panel. The quality of light mixing results, at least in part, from to the increased path length of a substantial portion of the emitted light emitted, in contrast to LED devices that directly emit light. The path length refers to the distance from the LED chip to the exit surface of the lighting apparatus. Although embodiments of the lighting apparatus may directly emit some light rays, the light rays that impinge on the reflector surface have a relatively long path length. The longer path length allows for greater overlap of rays from different colored LEDs mounted on the same substrate.

A method for transmitting light into a light guide is also described. One embodiment of the method includes providing a lighting device with a substrate substantially perpendicular to a light exit plane, emitting light in a direction substantially parallel to the light exit plane, and reflecting the light off of a reflective surface to redirect the light toward the light exit plane. Other embodiments of the method also may include propagating the light through the light exit plane and a transmission interface into a light guide, propagating the light through an optical lens between the lighting device and the transmission interface of the light guide, propagating the light through a plurality of encapsulants within the lighting device, or propagating the light through a phosphor encapsulant.

A method for making a lighting device is also described. One embodiment of the method includes providing a light emitting diode (LED) chip coupled to a substrate, encapsulating the LED chip on the substrate with a first encapsulant, and providing a reflector to reflect the light from the LED chip to a light exit plane perpendicular to the substrate. Another embodiment of the method also includes providing a second encapsulant between the first encapsulant and the reflector, coupling a thermal coupler to the substrate to transfer heat away from the substrate, or coupling a heat sink to the thermal coupler to transfer the heat away from the thermal coupler and the substrate.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 4 depicts a cross-section of one embodiment of an indirect LED device.

FIG. 5 depicts another cross-section of the indirect LED device of FIG. 4.

FIG. 6 depicts a cross-section of another embodiment of an indirect LED device to facilitate heat dissipation.

Throughout the description, similar reference numbers may be used to identify similar elements.

DETAILED DESCRIPTION

Figure 1:
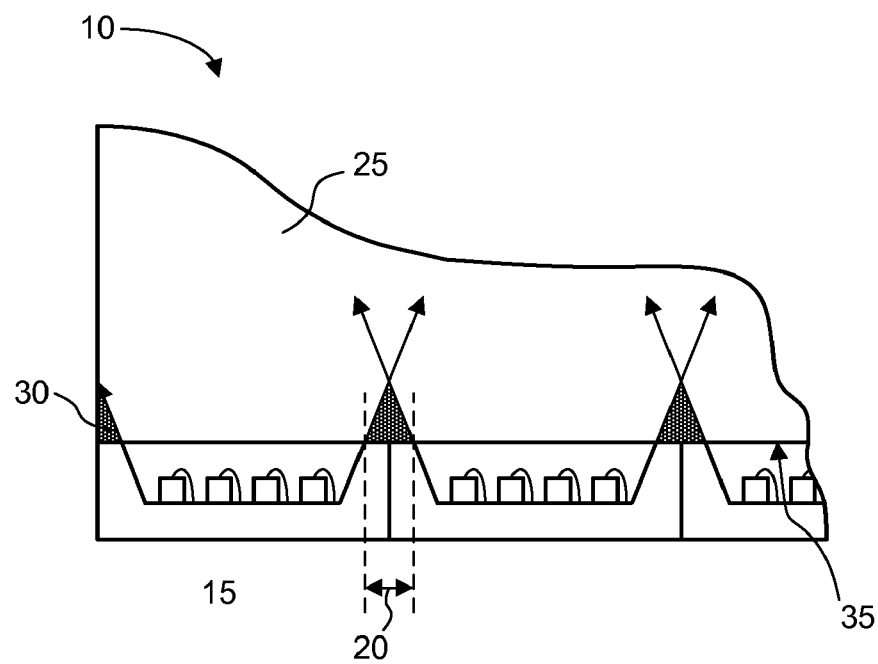
FIG. 1 depicts a conventional light system which uses LED devices having LEDs encapsulated in a common encapsulant.

FIG. 1 depicts a conventional light system 10 which uses LED devices 15 having LEDs encapsulated in a common encapsulant. Each LED device 15 has reflector walls, or sidewalls (i.e., the structural walls separating the LED dice, or chips, on adjacent LED devices), at both ends of the LED device. The separation distance between LEDs of adjacent LED devices is called pitch 20. The pitch 20 between the LED devices 15 at least partially determines the light pattern within the light guide plate 25. One example of a light guide plate 25 is a diffusion panel such as may be used in a liquid crystal display (LCD) panel.

The use of LED devices 15 with sidewalls to illuminate a light guide plate 25 results in dark spots 30 on the light guide plate 25. The dark spots 30 are due to the pitch 20 of the sidewalls of the LED devices 15 because the sidewalls block and prevent the light from mixing and passing through the transmission interface 35 (i.e., the edge through which the light enters) of the light guide plate 25. Where colored LEDs are used to produce white light, color variations also are visible by the user because the individual colors do not adequately mix with other colors. Ideally, the diffusion panel 25 would evenly diffuse the light from the LEDs throughout the surface of the diffusion panel 25 to provide an evenly distributed, white backlight for an LCD panel. However, the dark spots 30 and/or color variations resulting from the pitch 20 of the LED devices 15 may be visible to the user.

Figure 2:
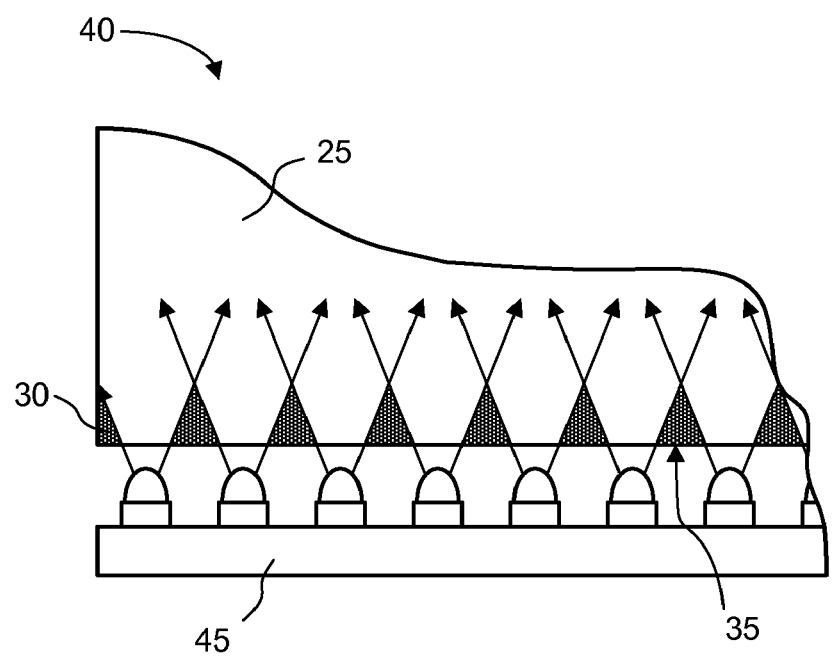
FIG. 2 depicts a conventional light system which uses LED devices having individual LED lenses.

FIG. 2 depicts a conventional light system 40 which uses LED devices 15 having individual LED lenses. LED devices 15 using an LED array 45 of LEDs with individual lenses can also cause dark spots 30 in the light guide plate 25. In particular, the dark spots 30 may appear between the individual LEDs. To reduce the appearance of dark spots 30 on an LCD panel, the LCD panel may be oversized so that the dark spots 30 are within a "black out" area not visible to the viewer. However, oversizing the LCD panel increases the cost and size of the LCD panel. Alternatively, the effective area of the LCD panel may be reduced, but reducing the effective area of the LCD panel would result in non-standard display ratios (i.e., display ratios other than 4:3, 16:9, etc.). Other conventional LCD panels address the issue by increasing the distance between the diffusion panel 25 and the LEDs, thus allowing the light to mix before propagating into the light guide plate 25. However, increasing the mounting distance in this manner also increases the cost and size of the LCD panel.

Figure 3:
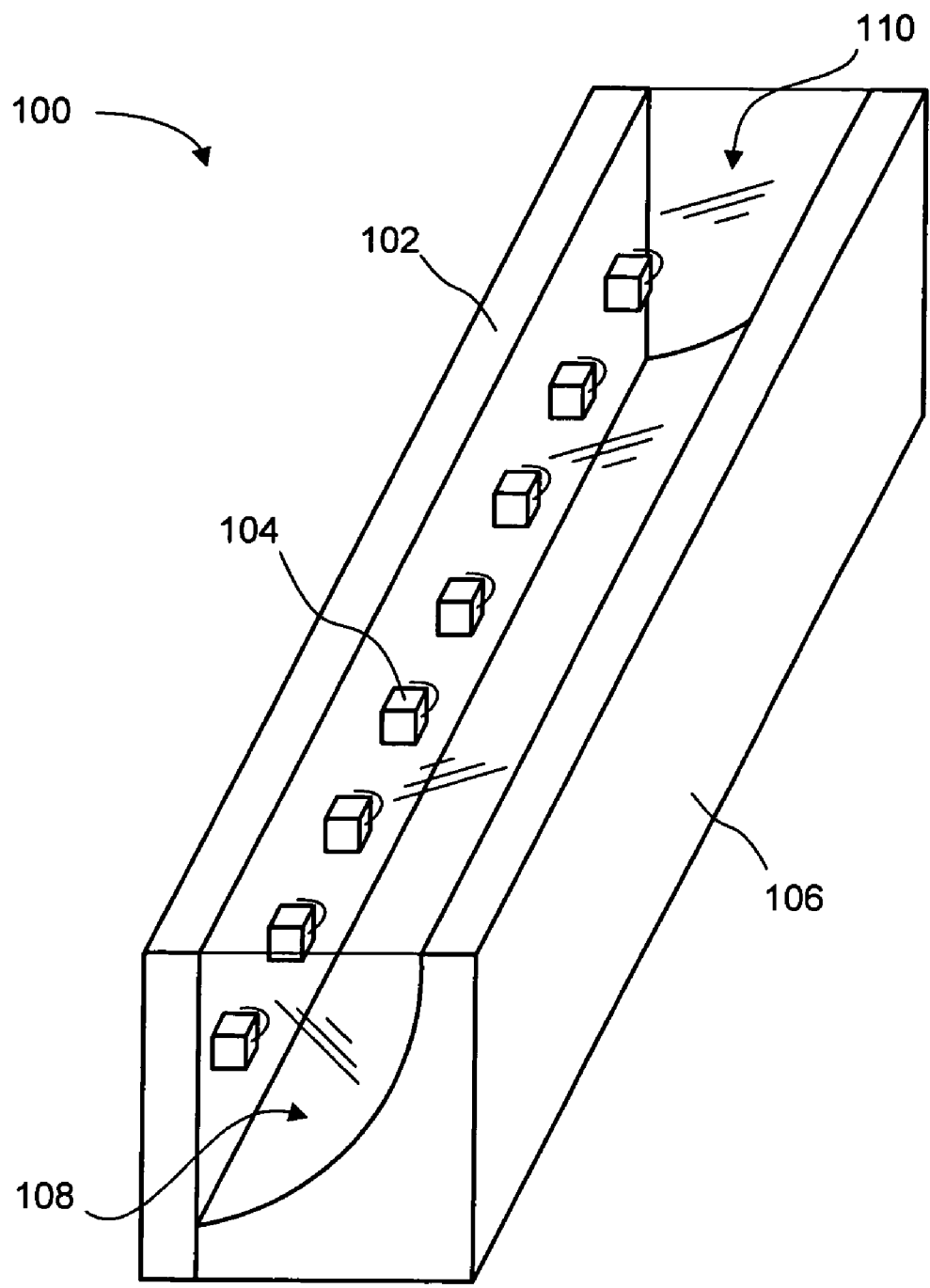
FIG. 3 depicts one embodiment of an indirect LED device for illuminating a light guide.

FIG. 3 depicts one embodiment of an indirect LED device 100 for illuminating a light guide. The illustrated LED device 100 includes a substrate 102 and several LED chips 104 (also referred to as LEDs or LED dice) mounted to the substrate 102. In one embodiment, the substrate 102 is a metal-coated plastic substrate. Other exemplary substrates 102 include a rigid printed circuit board (PCB), a flexible PCB, a metal core PCB, and a taped leadframe. However, the substrate 102 may be another type of substrate in other embodiments. The LEDs 104 may include one or more types of LEDs. In one embodiment, the LEDs 104 include red, green, and blue (RGB) LEDs. In another embodiment, the LEDs 104 may include white, cyan or other colors of LEDs. In another embodiment, the LEDs 104 may include "blue-converted" white LEDs (e.g., blue LEDs in combination with a phosphor resin). In another embodiment, the LEDs 104 may generate other colors by partially converting the LED light emissions from a lower to a higher wavelength to form a resulting combination of unconverted and converted light. Exemplary colors rendered by the combination of unconverted and converted light include cyan, green, yellow, orange, pink, and other colors. Furthermore, the LEDs 104 may be top-emitting LEDs or another type of LEDs.

In one embodiment, a reflector block 106 is mounted to the substrate 102. The reflector block 106 may be made from an aluminum core or another material that conducts heat. In another embodiment, the reflector block 106 may be fabricated from other materials. For example, the reflector block 106 may be plastic such as polycarbonate (PC), liquid crystal polymer (LCP), or another plastic material. The outer shape of the reflector block may be rectangular, curvilinear, polygonal, or another shape.

The reflector block 106 includes a reflector surface 108 which, when oriented relative to the LEDs 104, reflects light from the LEDs 104 toward an aperture to exit the LED device 100. More details of how light potentially travels within and exits the LED device 100 are shown and described with reference to FIGS. 4 and 5. The contour of the reflector surface 108 may be linear, curvilinear, angular, or another geometry. In one embodiment, the contour of the reflector surface 108 is approximately parabolic, with a portion next to the substrate 102 being approximately perpendicular to the substrate 102. This same portion may be approximately parallel to the light exit plane, which is also substantially perpendicular to the substrate 102. (One example of a light exit plane is shown and described in more detail with reference to FIGS. 4 and 5.) In another embodiment, the contour of the reflector surface 108 facilitates propagation of approximately parallel light rays from the LED device 100. Alternatively, the contour of the reflector surface 108 may facilitate diffusion of the light in one or more directions.

The reflector surface 108 may be implemented by applying a reflective coating to the reflector block 106, or may be a finished surface of the reflector block 106 itself. In certain embodiments, the reflector surface 108 may affect the reflected light in various ways. For example, the reflector surface 108 may include a diffusant or may be finished in such a way to scatter the reflected light in multiple directions. In another embodiment, the reflector surface 108 may include a layer or coating of phosphor/resin mix to generate a "blue-converted" white light.

The illustrated LED device 100 also includes an encapsulant 110 to protect the LEDs 104 on the substrate 102. One exemplary encapsulant 110 is silicone, although other translucent substances may be used to encapsulate the LEDs 104. The encapsulant 110 (or multiple encapsulants 110) is generally used to fill the space between the substrate 102, including the LEDs 104, and the reflector block 106. In one embodiment, the encapsulant 110 may contain diffusant particles to scatter the light from the LEDs 104. Exemplary diffusant particles include nano-particles, silica, titania, and quartz, although other diffusant particles may be used. In another embodiment, the encapsulant 110 may include phosphor to generate "blue-converted" white light, which may be used exclusively or in combination with other colors of LEDs 104.

FIG. 4 depicts a cross-section of one embodiment of an indirect LED device 100. The LED device 100 is located adjacent to and oriented to propagate light into a light guide 120. As an example, the LED 104 emits a light ray toward the reflector surface 108, which reflects the light ray toward the light guide 120. In this way, the light ray indirectly propagates (i.e., the light ray is reflected) into the light guide 120. Indirectly reflecting the light from the LED 104 to the light guide 102 may have certain advantages compared to conventional lighting devices. For example, embodiments of the indirect LED device 100 provide better color mixing of different colors of lights. Other embodiments may reduce the profile of the aperture (e.g., the surface area of the encapsulant 110 through which the light propagates between the substrate 102 and the reflector block 106) of the LED device 100. For example, in one embodiment, the profile of the aperture may be approximately three millimeters. Other embodiments which implement indirect reflection may reduce the cost of fabrication compared to conventional lighting devices. In another embodiment, the indirect LED device 100 may provide improved light collimation (i.e., the viewing angle) out of the aperture, as well as maximize light coupling efficiency to the light guide 120.

FIG. 5 depicts another cross-section of the indirect LED device 100 of FIG. 4. The illustrated LED device 100 depicts how light from the LED 104 may propagate into the light guide 120 in a substantially parallel manner. In particular, the reflector surface 108 may have a contour to reflect the light so that the light travels substantially parallel to the substrate 102, which is perpendicular to the light exit plane 124 (represented by the dashed line). The light exit plane 124 is the plane through which the light propagates as it exits the LED device 100. In one embodiment, the light exit plane 124 may be substantially parallel to the transmission interface 122 of the light guide 120.

FIG. 6 depicts a cross-section of another embodiment of an indirect LED device 130 to facilitate heat dissipation. The illustrated LED device 130 includes a substrate 102, an LED 104, and a reflector block 106, as described above, although shown in a slightly different configuration. The LED device 130 also includes a heat sink 132 coupled to the substrate 102. In one embodiment, the heat sink 132 conducts heat from the substrate 102 and dissipates the heat through convection or through conduction to another material. For example, the heat sink 132 may conduct heat to a metal plate, LCD packaging, or another heat dissipation material. Similarly, the reflector block 106 may be made of a material such as aluminum to facilitate heat dissipation. By dissipating heat from the LED device 130, the life of the LED 104 and LED device 130 may be extended compared to conventional lighting devices. In another embodiment, the LED device 130 may be more efficient than conventional lighting devices. Although the heat sink 132 is shown coupled directly to the substrate 102, other embodiments, of the LED device 130 may include interceding thermal pads, adhesives, or plates to conductively couple the substrate 102 to the heat sink 132. Furthermore, the heat sink 132 (and/or thermal pads) may be at least partially wrapped around (i.e., on multiple sides) the exterior of the LED device 130. Another example and additional description of heat dissipation are described below with reference to FIG. 15.

Figure 7A:
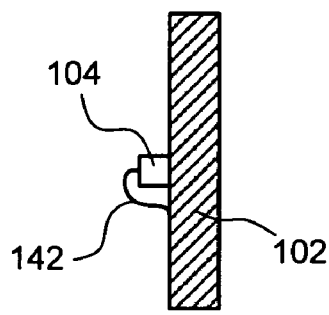
FIG. 7A depicts a production stage of one embodiment of an indirect LED device.
Figure 7B:
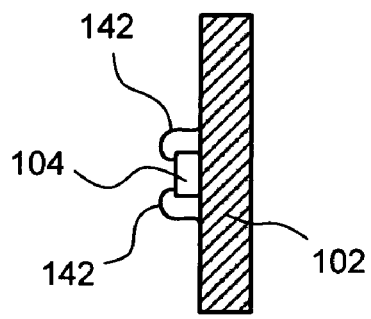
FIG. 7B depicts the production stage of FIG. 7A using another embodiment of an indirect LED device.
Figure 7C:
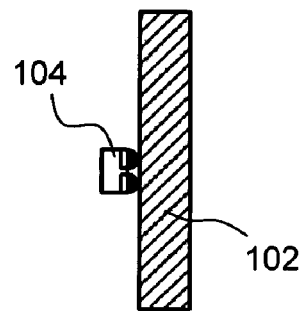
FIG. 7C depicts the production stage of FIG. 7A using another embodiment of an indirect LED device.

FIG. 7A depicts a production stage of one embodiment of an indirect LED device 100. In this production stage, the LED 104 is mounted to the substrate 102. A bonding wire 142 is provided to bond the LED 104 to the substrate 102. In one embodiment, the substrate 102 may be approximately three millimeters in length (from top to bottom as shown in FIG. 7A), although other sizes of substrates may be implemented. Alternatively, other production methods may be used to suit the type of LED 104 that is used. For example, FIG. 7B depicts the production stage of FIG. 7A using another embodiment of an indirect LED device 100, namely, a 2-wire InGaN LED 104 on a sapphire substrate 102. As another example, FIG. 7C depicts the production stage of FIG. 7A using another embodiment of an indirect LED device 100, namely, a flip-chip LED 104.

Figure 8:
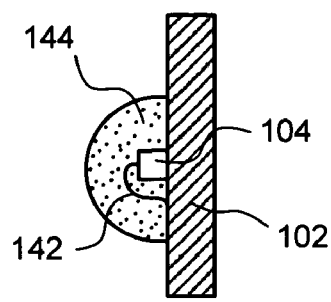
FIG. 8 depicts another production stage of the indirect LED device of FIG. 7A.

FIG. 8 depicts another production stage of the indirect LED device 100 of FIG. 7A. In this production stage, a first encapsulant 144 is used to encapsulate the LED 104 and the bonding wire 142 on the substrate 102. The first encapsulant 144 may include a phosphor, a diffusant, or another filler. Alternatively, the first encapsulant 144 may be free of fillers.

Figure 9:
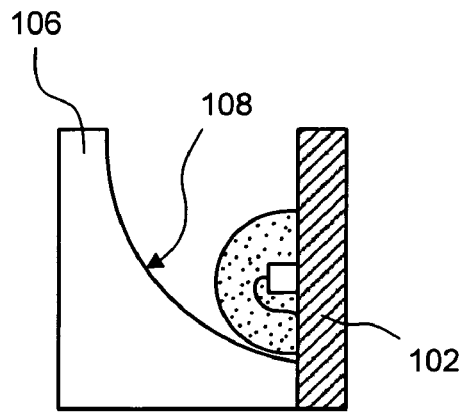
FIG. 9 depicts another production stage of the indirect LED device of FIG. 7A.

FIG. 9 depicts another production stage of the indirect LED device 100 of FIG. 7A. In this production stage, the reflector block 106 is coupled to the substrate 102. Although the reflector block 106 is shown coupled to the substrate 102 in a particular configuration, other configurations may be implemented. In one embodiment, the reflector block 106 is adhered to the substrate. The reflector surface 108 is oriented with respect to the LED 104 so that light from the LED 104 is reflected toward the light exit plane 124 of the LED device 100.

Figure 10:
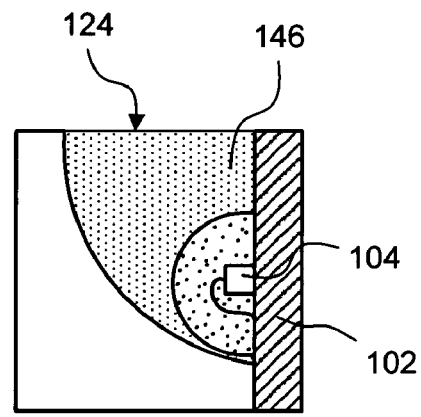
FIG. 10 depicts another production stage of the indirect LED device of FIG. 7A.

FIG. 10 depicts another production stage of the indirect LED device 100 of FIG. 7A. In this production stage, a second encapsulant 146 is disposed within the remaining space between the substrate 102 and the reflector block 106. In one embodiment, the second encapsulant 146 encapsulates the first encapsulant 144 on the substrate 102. The second encapsulant 146 may include no fillers or may include a phosphor, a diffusant, or another filler.

Although FIGS. 7A-10 depict one example of how an LED device 100 may be manufactured, other manufacturing operations may be performed in addition to or instead of the production stages shown and described above. In particular, the operations implemented to manufacture an LED device 100 may be tailored to accommodate certain processes, materials, or other manufacturing considerations.

Figure 11:
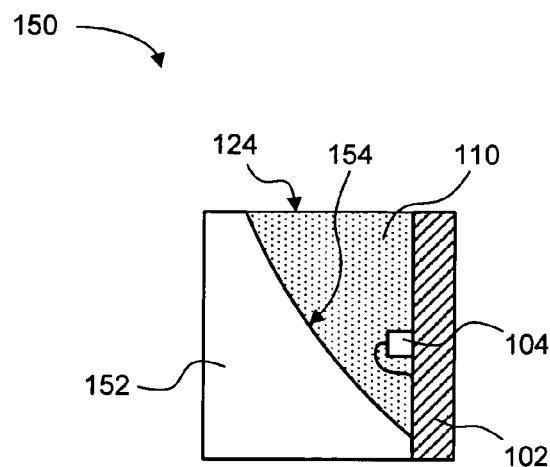
FIG. 11 depicts an alternative embodiment of an indirect LED device.

FIG. 11 depicts an alternative embodiment of an indirect LED device 150. The illustrated LED device 150 includes a substrate 102 and an LED 104 mounted to the substrate 102. The substrate 102 is substantially perpendicular to the light exit plane 124. The reflector block 152 is also coupled to the substrate 102 and includes a reflector surface 154 that is curvilinear, but not necessarily parabolic. In another embodiment, the reflector surface 154 may be linear.

Figures 12A, 12B:
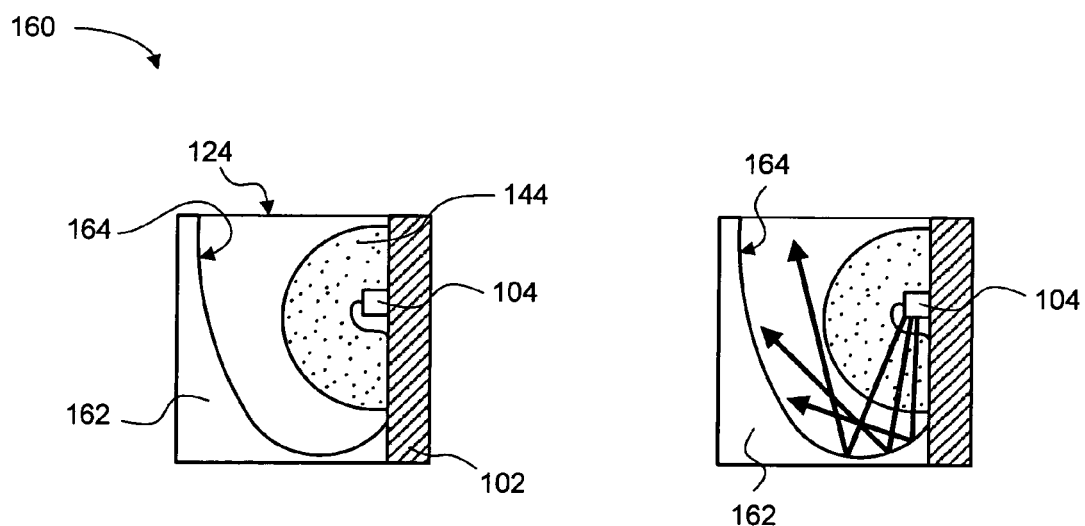
FIG. 12A depicts another embodiment of an indirect LED device.
FIG. 12B depicts exemplary light ray paths using the re-entrant reflector block of the indirect LED device of FIG. 12A.

FIG. 12A depicts another embodiment of an indirect LED device 160. The illustrated LED device 160 includes a substrate 102 and an LED 104 mounted to the substrate 102. The substrate 102 is substantially perpendicular to the light exit plane 124. The reflector block 162 is also coupled to the substrate 102 and includes a reflector surface 164. The reflector surface 164 is curvilinear and has a concave shape with a profile of a re-entrant curve. The LED device 160 has a lens formed from a first encapsulant 144. In another embodiment, the LED device 160 also may include a second encapsulant 146. FIG. 12B depicts exemplary light ray paths using the re-entrant reflector block 162 of the indirect LED device 160 of FIG. 12A. In particular, some of the light rays impinge on the reflector surface 164 at several locations, while other light rays impinge at a single location, and other light rays propagate directly to the light exit plane 124. The light rays that reflect multiple times may provide additional light mixing compared to the light rays that are reflected only once.

Figure 13:
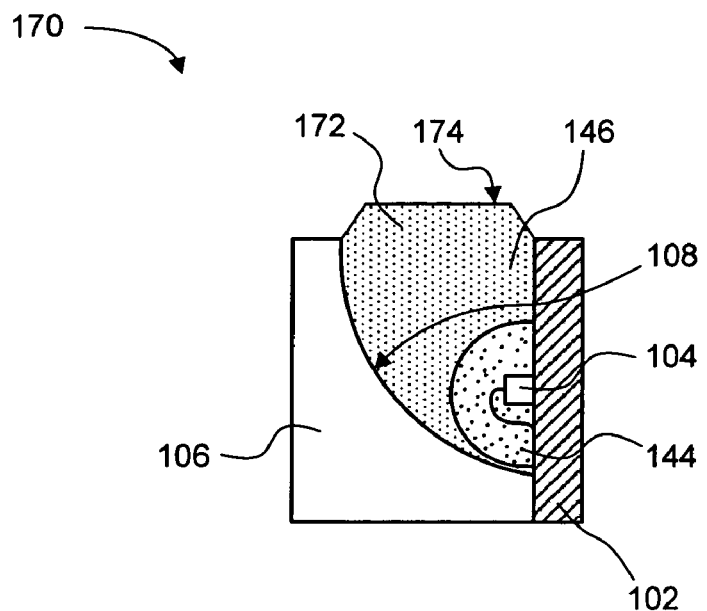
FIG. 13 depicts another embodiment of an indirect LED device having an optical lens.

FIG. 13 depicts another embodiment of an indirect LED device 170 having an optical lens 172. The optical lens 172 facilitates directing the light in a predetermined light distribution pattern as it propagates through the light exit plane 174 and out of the LED device 170. The optical lens 172 also may be referred to as a micro lens. In one embodiment, the optical lens 172 is integrated with the second encapsulant 146. In another embodiment, the optical lens 172 may be separate from, but coupled to, the second encapsulant 146. Alternatively, the optical lens 170 may be coupled to the reflector block 106, the substrate 102, the light guide 120 (not shown), or another component of the lighting system.

Figure 14:
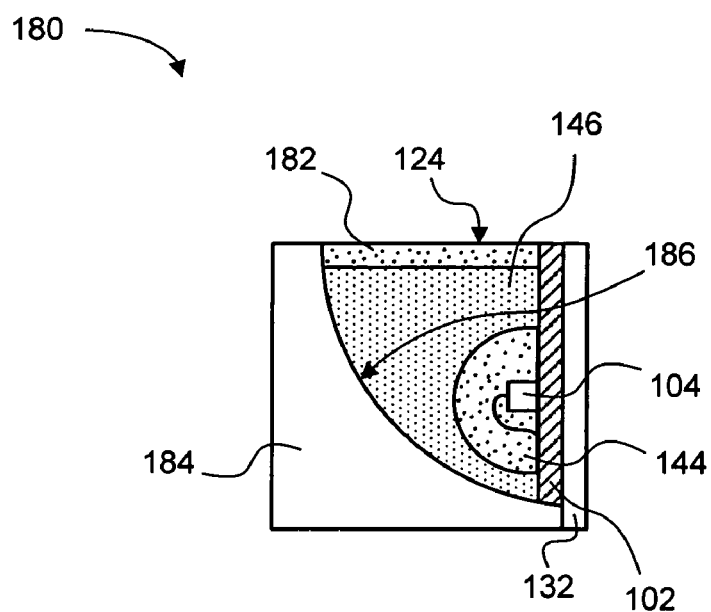
FIG. 14 depicts another embodiment of an indirect LED device having a phosphor lens.

FIG. 14 depicts another embodiment of an indirect LED device 180 having a phosphor lens 182. The phosphor lens 182 may facilitate generating a "blue-converted" white light from a blue LED 104. In one embodiment, the phosphor lens is coupled between the substrate 102 and the reflector surface 186 of the reflector block 184. Alternatively, the phosphor lens 182 may be coupled to the LED device 180 at the reflector block 184, the substrate 102, or another component of the LED device 180.

Figure 15:
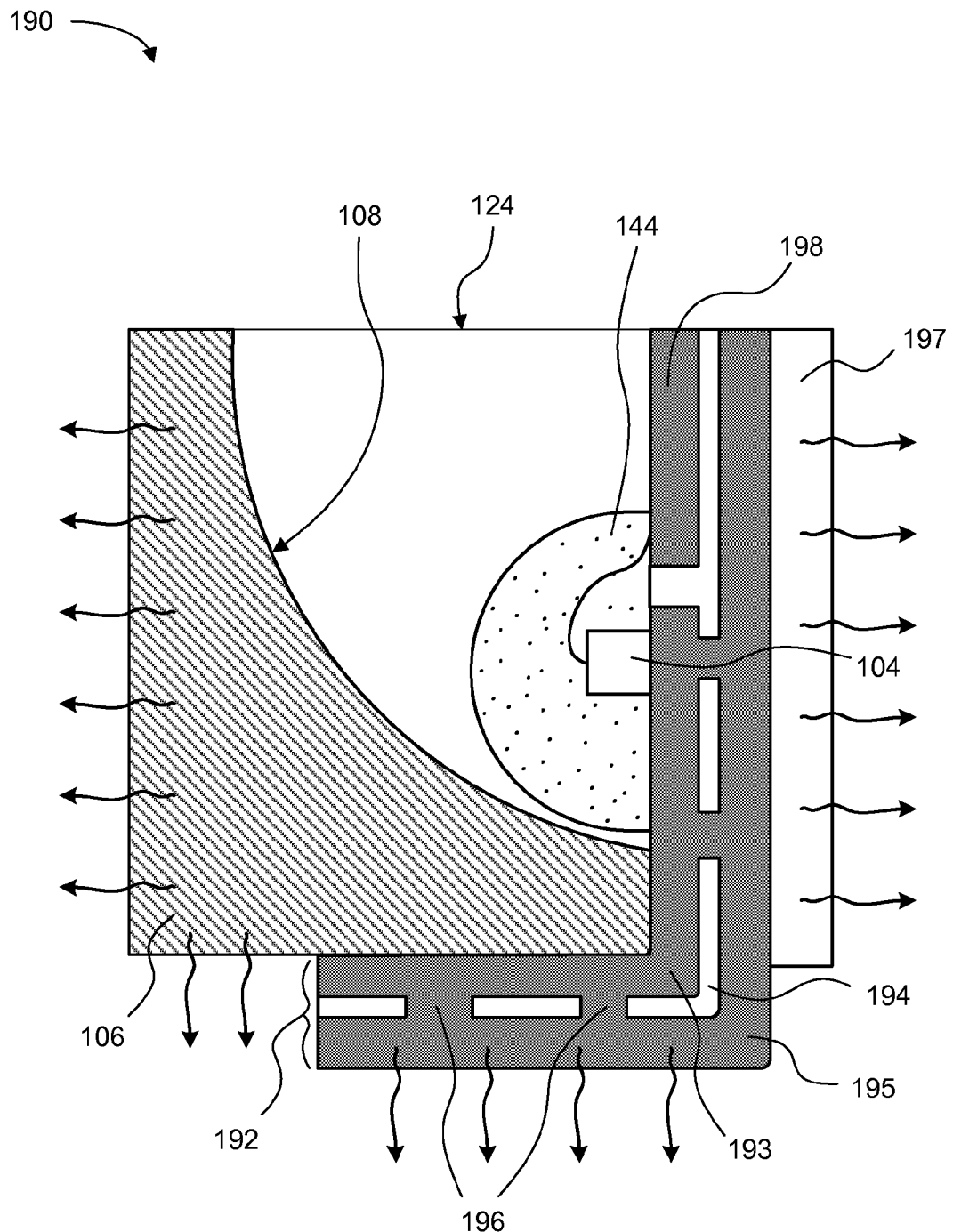
FIG. 15 depicts another embodiment of an indirect LED device to illustrate heat dissipation from the indirect LED device.

FIG. 15 depicts another embodiment of an indirect LED device 190 to illustrate heat dissipation from the indirect LED device 190. The illustrated LED device 190 includes a substrate 192 and an LED 104 coupled to the substrate 192. A first encapsulant 144 encapsulates the LED 104 on the substrate 192. A reflector block 106 with a reflector surface 108 is coupled to a flexible and bendable substrate 192, which wraps around an end of the reflector block 106. In the absence of a second encapsulant 146, an air gap exists between first encapsulant 144 and the reflector block 106, although other embodiments may include a second encapsulant 146.

In one embodiment, the flexible substrate 192 includes a top thermally and electrically conducting layer 193 (also referred to as a top electrode layer), an insulative middle core layer 194, and a bottom thermally conducting layer 195. The top electrode layer 193 provides the LED chip 104 with an electrical connection to one or more external terminals (not shown). One or more thermal vias 196 provide for heat dissipation from the top thermally conducting layer 193 through the middle core layer 194 to the bottom thermally conducting layer 195. In one embodiment, a heat sink 197 is coupled to the exposed surface of the bottom thermally conducting layer 195 to facilitate heat dissipation. Heat is conducted away from the LED chip 104 through the top thermally conducting layer 193, the thermal vias 196, and the bottom thermally conducting layer 195. A second top electrode layer 198 provides a second electrical connection to one or more external terminals (not shown) for the LED chip 104. In one embodiment, the top layer 193, the bottom layer 195, and the second electrode layer 198 are copper (Cu), the middle core layer 194 is a polyimide material, and the thermal vias 196 are blind vias. Other embodiments of the LED device 190 may include other materials, as well as other structural variations.

Figure 16:
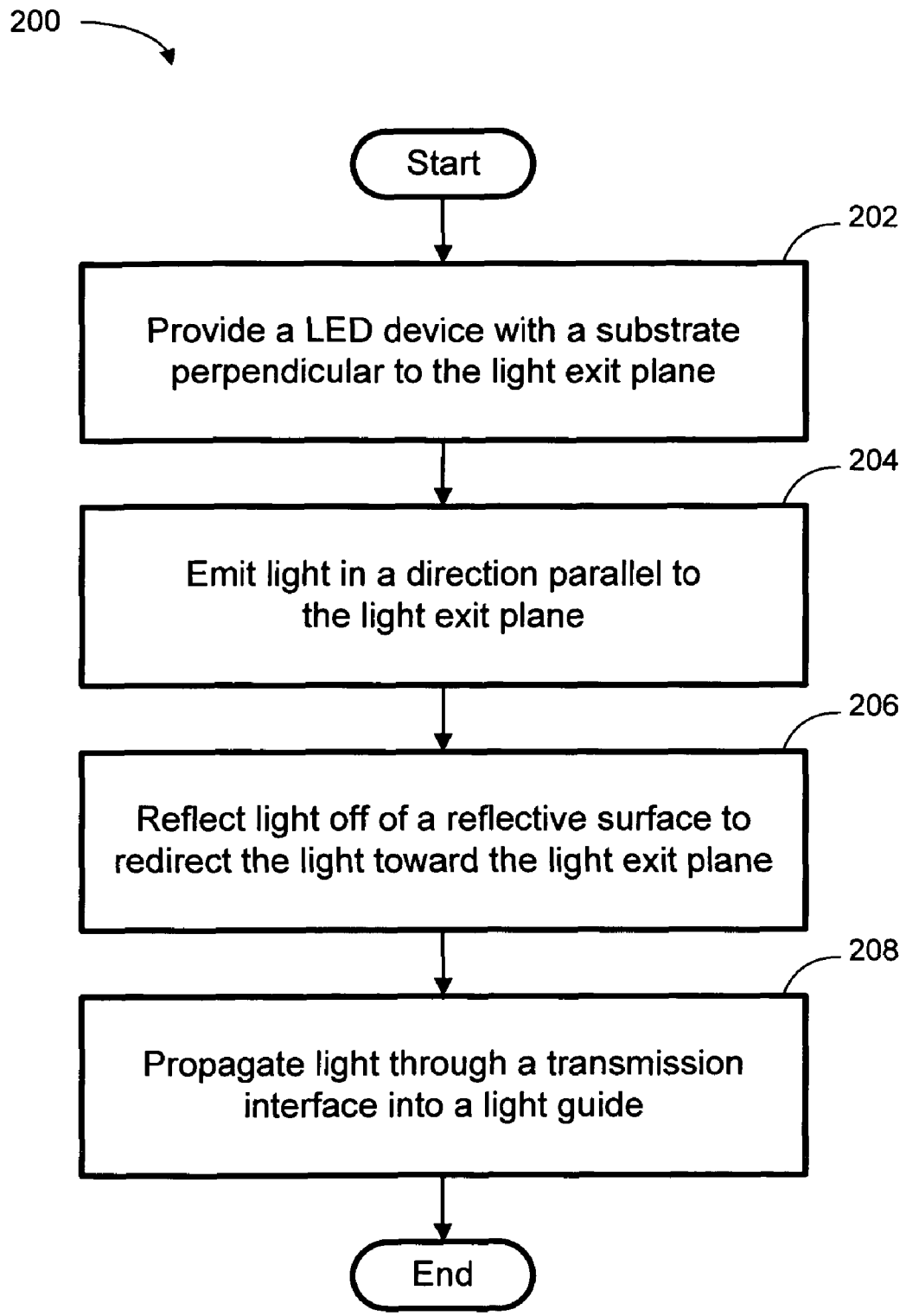
FIG. 16 is a process flow diagram of an indirect lighting method which may be used in conjunction with an indirect LED device.

FIG. 16 is a process flow diagram of an indirect lighting method 200 which may be used in conjunction with an indirect LED device 100. At block 202, an LED device 100 is provided. The LED device 100 includes a substrate 102 that is substantially perpendicular to the light exit plane 124 of the LED device 100. At block 204, the LED 104 emits light in a direction substantially parallel to the light exit plane 124. In one embodiment, the LED 104 is a top-emitting LED to emit light away from and perpendicular to the substrate 102. At block 206, the reflective surface 108 reflects the light and redirects the light toward the light exit plane 124 of the LED device 100. At block 208, the light propagates through a transmission interface 122 of a light guide 120 and into the light guide 120.

Figure 17:
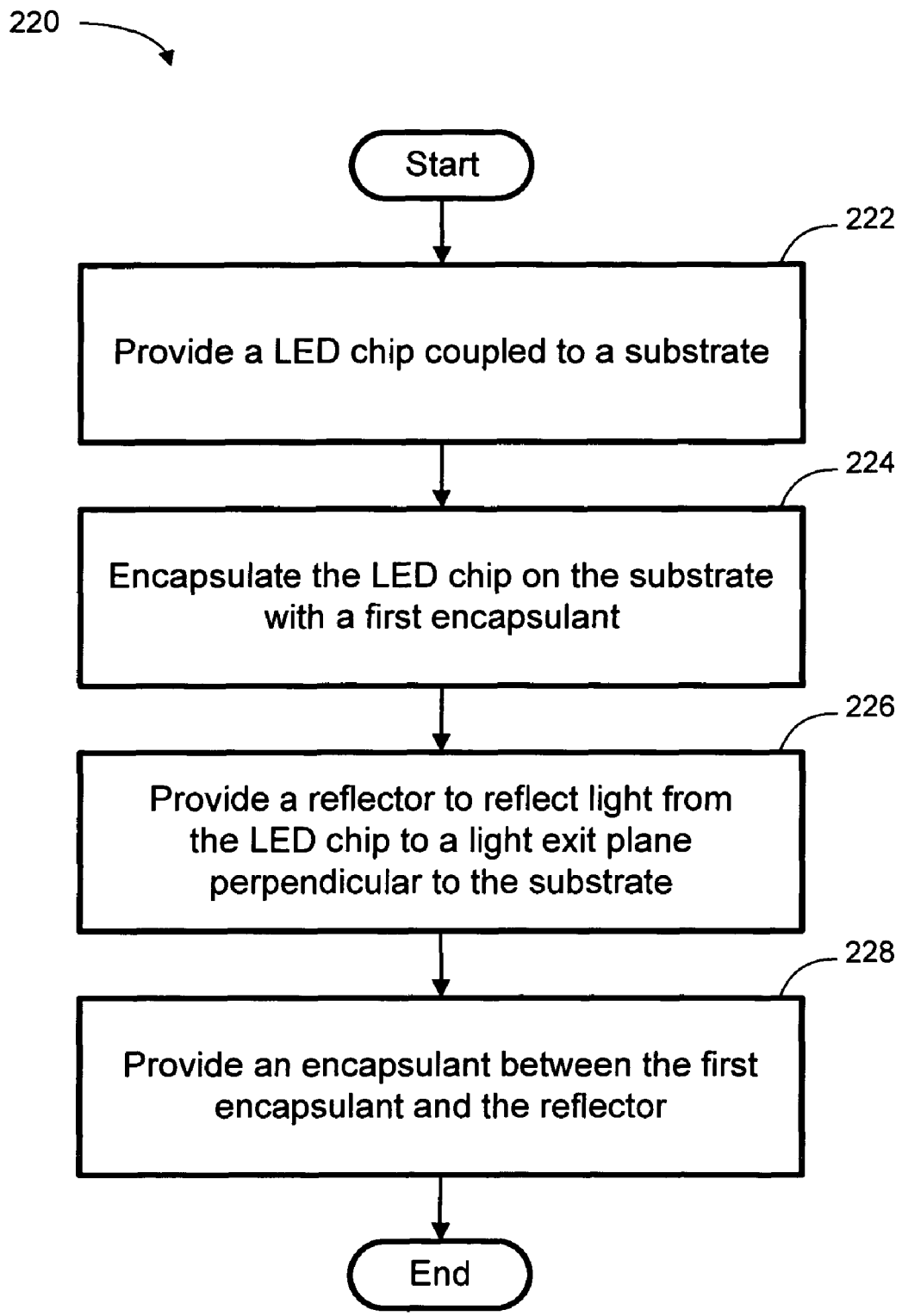
FIG. 17 is a process flow diagram of a manufacturing method which may be used to manufacture an indirect LED device.

FIG. 17 is a process flow diagram of a manufacturing method 220 which may be used to manufacture an indirect LED device 100. At block 222, an LED chip 104 coupled to a substrate 102 is provided. At block 224, the LED chip 104 is encapsulated on the substrate 102 with a first encapsulant 144. At block 226, a reflector 106 is provided to reflect light from the LED chip 104 to a light exit plane 124 which is perpendicular to the substrate 102. The reflector 106 includes a reflector surface 108 to reflect the light. At block 228, a second encapsulant 146 is provided between the first encapsulant 144 and the reflector 106.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A lighting apparatus comprising:
a substrate;
a first encapsulant to encapsulate the plurality of lighting elements a second encapsulant to encapsulate at least a portion of the first encapsulant;
a plurality of lighting elements coupled to the substrate to emit light through a light exit plane substantially perpendicular to the substrate; and
a reflector block coupled to the substrate, wherein the reflector block comprises a single reflector surface to reflect the light from the plurality of lighting elements to the light exit plane, wherein the reflector block and the substrate are configured to directly contact a transmission interface of a light guide.

2. The lighting apparatus of claim 1 wherein the reflector surface defines a contour configured to direct the light to the light exit plane in a direction substantially orthogonal to the light exit plane.

3. The lighting apparatus of claim 1 further comprising a non-planar optical lens at the light exit plane, wherein the non-planar optical lens is coupled to or integrated with an encapsulant between the plurality of lighting elements and the reflector block.

4. The lighting apparatus of claim 1 wherein:
the plurality of lighting elements comprise light emitting diodes (LEDs); and
the first encapsulant comprises a wavelength conversion material to at least partially convert the light from a first wavelength to a second wavelength.

5. The lighting apparatus of claim 1 wherein the first encapsulant comprises diffusant particles to scatter the light within the first encapsulant.

6. The lighting apparatus of claim 1 further comprising a heat sink coupled to the substrate to transfer the heat away from the substrate, wherein the substrate comprises a folded flexible substrate comprising:
a top thermally conductive layer;
a bottom thermally conductive layer separated from the top thermally conductive layer by a middle core layer; and
a plurality of thermal vias through the middle core layer to thermally couple the top and bottom thermally conductive layers.

7. A method for transmitting light into a light guide comprising:
providing a lighting device with a substrate substantially perpendicular to a light exit plane;

emitting light in a direction substantially parallel to the light exit plane, wherein the light originates from a plurality of lighting elements coupled to the substrate;

propagating the light through a plurality of encapsulants within the lighting device; and reflecting the light from the plurality of lighting elements off of a single reflective surface of a reflector block to redirect the light toward the light exit plane, wherein the reflector block and the substrate directly contact a transmission interface of the light guide.

8. The method of claim 7 wherein at least one of the plurality of encapsulants includes diffusant particles to scatter the light within the corresponding encapsulant.

9. The method of claim 7 further comprising propagating the light through a phosphor encapsulant, wherein the phosphor encapsulant is configured to convert blue light into white light.

10. A method for making a lighting device comprising:
providing a plurality of light emitting diode (LED) chips coupled to a substrate;
coupling a heat sink to the substrate to transfer heat away from the substrate, wherein the substrate comprises a folded flexible substrate comprising a top thermally conductive layer, a bottom thermally conductive layer separated from the top thermally conductive layer by a middle core layer, and a plurality of thermal vias through the middle core layer to thermally couple the top and bottom thermally conductive layers;
encapsulating the plurality of LED chips on the substrate with a first encapsulant; and
providing a single reflector to reflect the light from the plurality of LED chips to a light exit plane perpendicular to the substrate, wherein the reflector and the substrate are configured to directly contact a transmission interface of a light guide.

11. The method of claim 10, further comprising providing a second encapsulant between the first encapsulant and the reflector.

12. The method of claim 10, wherein the reflector comprises a parabolic reflector.

13. A lighting apparatus comprising:
a substrate;
a first encapsulant to encapsulate the plurality of lighting elements, wherein the first encapsulant comprises a wavelength conversion material to at least partially convert the light from a first wavelength to a second wavelength;
a plurality of lighting elements coupled to the substrate to emit light through a light exit plane substantially perpendicular to the substrate, wherein the plurality of lighting elements comprise light emitting diodes (LEDs); and
a reflector block coupled to the substrate, wherein the reflector block comprises a single reflector surface to reflect the light from the plurality of lighting elements to the light exit plane, wherein the reflector block and the substrate are configured to directly contact a transmission interface of a light guide.

14. The lighting apparatus of claim 13, further comprising a non-planar optical lens at the light exit plane, wherein the non-planar optical lens is coupled to or integrated with an encapsulant between the plurality of lighting elements and the reflector block.

15. The lighting apparatus of claim 13, wherein the first encapsulant comprises diffusant particles to scatter the light within the first encapsulant.

16. The lighting apparatus of claim 13, further comprising a heat sink coupled to the substrate to transfer the heat away from the substrate, wherein the substrate comprises a folded flexible substrate comprising:
a top thermally conductive layer;
a bottom thermally conductive layer separated from the top thermally conductive layer by a middle core layer; and
a plurality of thermal vias through the middle core layer to thermally couple the top and bottom thermally conductive layers.

17. A method for transmitting light into a light guide comprising:
providing a lighting device with a substrate substantially perpendicular to a light exit plane;
emitting light in a direction substantially parallel to the light exit plane, wherein the light originates from a plurality of lighting elements coupled to the substrate;
propagating the light through a phosphor encapsulant, wherein the phosphor encapsulant is configured to convert blue light into white light; and
reflecting the light from the plurality of lighting elements off of a single reflective surface of a reflector block to redirect the light toward the light exit plane, wherein the reflector block and the substrate directly contact a transmission interface of the light guide.

18. The method of claim 17, further comprising propagating the light through the light exit plane and a transmission interface into a light guide, wherein the transmission interface of the light guide is substantially parallel to the light exit plane.

19. The method of claim 17, further comprising propagating the light through an optical lens between the lighting device and the transmission interface of the light guide.

20. The method of claim 17, further comprising transferring heat away from the substrate and to a heat sink.

* * * * *